United States Patent
Seeley et al.

[11] Patent Number: 5,811,224
[45] Date of Patent: Sep. 22, 1998

[54] PROCESS FOR REJUVENATING DEVELOPER IN PRINTING PLATE DEVELOPMENT

[75] Inventors: Douglas A. Seeley, High Bridge; George L. Malinoski, Jr., Somerville; David M. Sullivan, deceased, late of Bridgewater; Judith Ann Sullivan, Bridgewater, all of N.J., executor

[73] Assignee: Bayer Corporation, Pittsburgh, Pa.

[21] Appl. No.: 273,687

[22] Filed: Aug. 24, 1994

[51] Int. Cl.⁶ .................................................. G03C 11/24
[52] U.S. Cl. .......................................... 430/399; 210/651
[58] Field of Search .................................... 354/316, 318; 134/111; 210/651, 500.41; 101/450.1, 463.1; 430/30, 302, 398, 399

[56] References Cited

U.S. PATENT DOCUMENTS

| | | | |
|---|---|---|---|
| 3,327,721 | 6/1967 | Carlson | 134/111 |
| 4,029,582 | 6/1977 | Ishii et al. | 210/500.41 |
| 4,207,182 | 6/1980 | Marze | 210/500.41 |
| 4,239,368 | 12/1980 | Krause et al. | 134/111 |
| 4,333,485 | 6/1982 | Karlsson et al. | 134/111 |
| 4,714,558 | 12/1987 | Barbee et al. | 134/111 |
| 4,786,417 | 11/1988 | Miki et al. | 210/639 |
| 4,814,082 | 3/1989 | Wrasidlo | 210/490 |
| 4,976,859 | 12/1990 | Wechs | 210/500.41 |
| 5,009,824 | 4/1991 | Walch et al. | 210/500.41 |
| 5,112,491 | 5/1992 | Strantz, Jr. | 210/651 |
| 5,124,736 | 6/1992 | Yamamoto et al. | 324/325 |
| 5,151,183 | 9/1992 | Sedath et al. | 210/500 |
| 5,279,739 | 1/1994 | Pemawansa | 210/500.41 |
| 5,401,414 | 3/1995 | Wack et al. | 210/651 |

FOREIGN PATENT DOCUMENTS

| | | | |
|---|---|---|---|
| 4-79224 | 3/1992 | Japan | 134/111 |
| 4-79225 | 3/1992 | Japan | 134/111 |
| WO 94/10611 | 5/1994 | WIPO . | |

*Primary Examiner*—Glenn A. Caldarola
*Attorney, Agent, or Firm*—Richard S. Roberts; Andrew F. Sayko, Jr.

[57] ABSTRACT

This invention pertains to an ultrafiltration process which maintains a constant developer strength in a printing plate developing operation. Such a process enables development of more plates than conventional processes while using less developer and generating less liquid waste. The ultrafiltration process is suitable for both batch and continuous plate development operations. By this process, used developer is filtered and the fluid portion returned to the working developer solution. The filtered out remainder mass is treated with an absorber to convert it into a solid.

12 Claims, 1 Drawing Sheet

PROCESS FOR REJUVENATING DEVELOPER IN PRINTING PLATE DEVELOPMENT

FIELD OF THE INVENTION

This invention discloses a novel separation process and an apparatus to practice said process, with general utility in the photographic and lithographic industries. The process utilizes, and the apparatus employs, an ultrafiltration membrane in a novel manner which allows the continuous exclusion of high molecular weight molecules and solid particles from a developing bath, thereby allowing a development process with substantially constant developer strength. Additionally, the method allows a mechanism to dispose of aqueous liquid waste from a printing plate development process as a concentrated solid waste.

BACKGROUND OF THE INVENTION

The art of lithography generally employs several steps to process printing plates, similar to the photographic industry which employs several processing steps to process exposed photographic film. Some such steps are developing, fixing, washing and the like. Each step employs a working solution and it is customary in the industry to keep the performance of each working solution substantially constant as a large amount of plates are processed.

A key step in the preparation of printing plates is the development of imagewise exposed plates. Conventional development steps are generally soak-and-rinse type operations, and generally suffer from a continually changing developer strength. To avoid this problem, components consumed in the development step are typically compensated by periodic replenishment. Primarily for environmental and economic reasons, efforts are being made in the industry to drastically reduce the use of replenishers including the washing water which is a replenisher for the washing step. Even modern water-less automatic processors result in the discharge of fairly large quantities of waste solutions. Thus, there is a continuing interest in identifying new methods wherein developer strengths are maintained at a substantially constant level and the amount of waste solutions is minimized.

U.S. Pat. No. 5,015,560 describes a method whereby the working solution in a photographic process is treated with a resin capable of absorbing liquids to produce a solid form of the waste which is then disposed of Examples of suitable resins disclosed include polysaccharides, starch derivatives and vinyl polymers.

Other conventional processes use cross-filtering ultrafiltration membranes which results in a working fluid being concentrated in solutes and suspended materials while the water, solvents and other lighter molecular weight materials permeate through to a clean fluid reservoir. If a clean fluid is desired to be the working fluid, a batch process may be used, where the working reservoir is emptied and used as the clean reservoir. However, it still suffers from several drawbacks. A batch process, for example, requires an off-line holding tank, transfer pumps, and an exhaustion-detection method. Also purging the cartridge may require special skills and must be done off-line. Thus, it requires a manual intervention or a complicated robotic process to keep the system cleaning while the system is working (collecting new heavy molecules and other unwanted materials). Another disadvantage is that the working fluid is varying in dirtiness, as it gets slowly dirtier and then suddenly clean, which, in many processes including printing plate processors, may result in dirt shocking out in the processor, requiring manual cleanup and parts damage.

It is, therefore, an object of this invention to provide a process to provide a development system wherein the strength and activity of the working fluid stay substantially constant through the process with no need to replenish with water or other suitable chemicals. It will be desirable if the process is flexible enough to accommodate both batch and continuous operations.

It is another object of this invention to provide a process whereby the dirtied fluid in a development bath continuously undergoes a filtration mechanism to exclude solid particles.

It is a further object of this invention to provide a process whereby the aqueous liquid wastes from a development process are disposed of a concentrated solid waste.

It is yet another object of this invention to provide an apparatus suitable to achieve the above and other objects.

Other objects and advantages of the present invention shall become apparent from the accompanying description and drawings.

SUMMARY OF THE INVENTION

One or more objects of the present invention are accomplished by the inventive process suitable for use in the developing steps in the photographic and lithographic industries, particularly in the printing plate industry. The process rejuvenates developer liquid such that it remains substantially constant in developing activity and retains its strength while developing several times more plates than is possible without the inventive process.

Illustrative of its use in the printing plate industry, the process comprises passing used printing plate developer from a processor tank through one or more ultrafiltration membranes, whereby the water and low molecular weight materials in the developer are permeated back into the processor tank for further development, while the remainder, comprising particles (such as pigment, resin, dirt, and the like), as well as high molecular weight molecules (such as resins, photosensitive materials, other polymers, and the like), is retained in a dirty developer receptacle. This concentrated dirty developer is then treated with a polymeric superabsorbent material, thus converting it into a solid. This solid may then be disposed of as a solid waste. The inventive process is designed such that the treatment of the developer through the filter is capable of being carried out continuously during use without having to stop the developing apparatus (processor tank) or draining it.

The process is flexible and can be used for batch or continuous plate development by suitable plumbing arrangement and by adjusting the rate of flow of fluid through the various steps. Thus, for example, an indirect replenishment system may be added to the above apparatus, whereby the liquid level in the processor tank is continually monitored and maintained at a constant level, thus leading to a continuous operation. The process is also flexible enough to be equipped with other improvements such as, for example, ability to maintain constant pressure on the dirty side of the ultrafilter while maintaining a constant flow rate.

The inventive process offers ability to maintain plate processors at a substantially constant developer strength. This reduces cleaning servicing requirements. Use of the ultrafilter membranes makes the developer last longer, reducing developer consumption and reducing liquid waste. Also concentrating and absorbing the dirty developer eliminates liquid waste. Furthermore, the ability to use more than one filter enables the system to run simultaneously on more than one cartridge to increase flow rate while increasing efficiency without shutting down the system.

BRIEF DESCRIPTION OF THE DRAWINGS

The invention is described in detail below with reference to FIG. 1 which is a flow diagram of a continuous development process of the present invention as described in Examples which follow.

DESCRIPTION OF THE PREFERRED EMBODIMENTS

Figure 1:
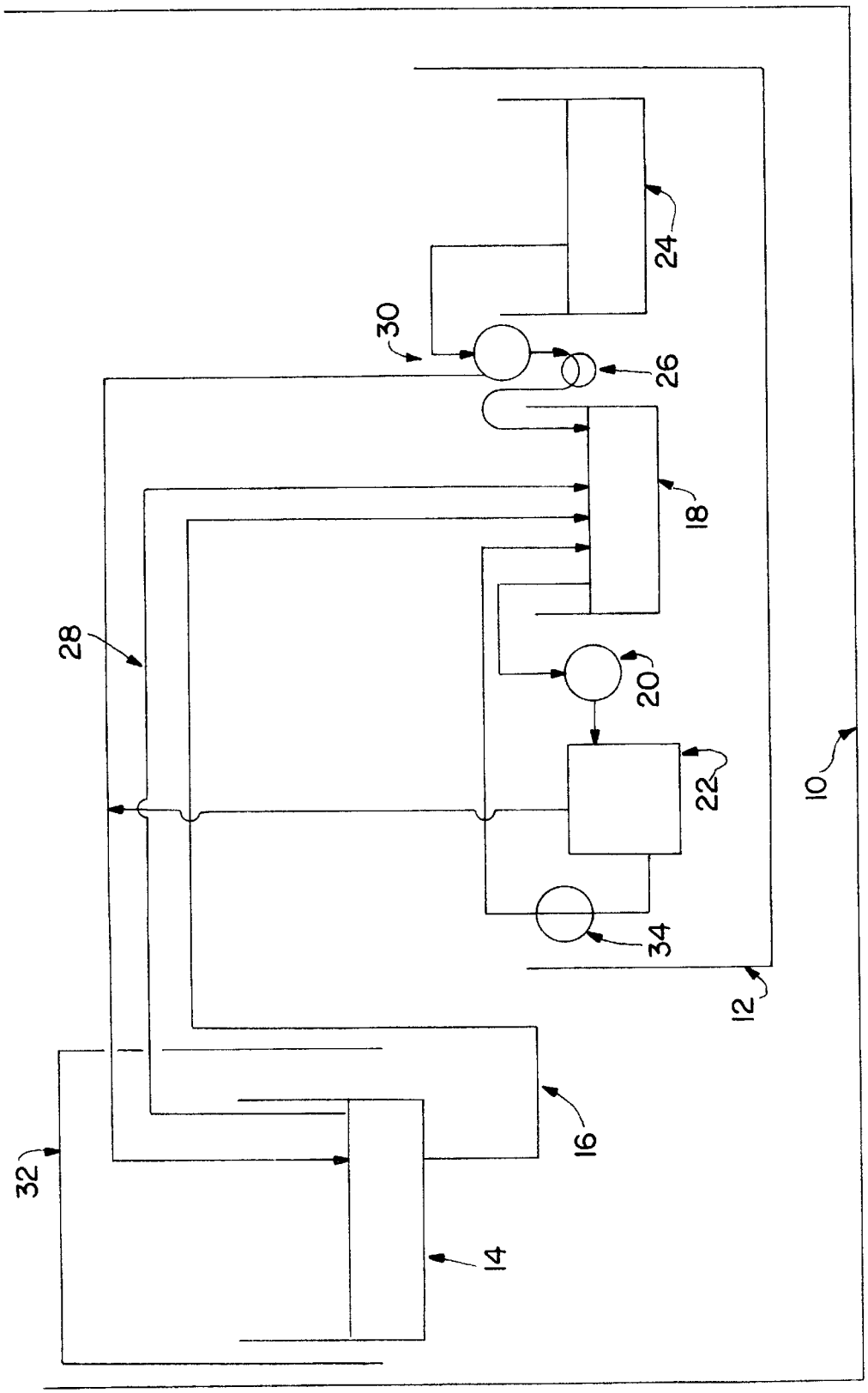

The inventive process advantageously rejuvenates developer liquid such that it remains substantially constant in developing activity and retains its strength while continually developing several times more plates than is possible without the inventive process. In one embodiment, as applicable to the printing plate industry, the method comprises passing used printing plate developer contained in a processor tank through one or more ultrafiltration membranes, whereby the water and low molecular weight materials in the developer are permeated into a receptacle for clean developer, while the remainder, comprising particles as well as high molecular weight molecules, is retained in the dirty developer receptacle. While the inventive process has been described below with reference to the inventive apparatus in FIG. 1, it is to be understood, however, that such description is for purposes of exposition only and not for purposes of limitation of either the process or the apparatus.

An apparatus 10, schematically depicted in FIG. 1, is an apparatus according to the present invention for rejuvenating printing plate developers in a manner such that the developer strength stays substantially constant. Apparatus 10 includes a lid, 32, a catch pan 12 and a suitable processor means, such as a tank, 14. The development of printing plates occurs in the tank 14, thus generating a dirty developer. A draining mechanism 16 drains the dirty developer, either through the side walls of the processor tank 14 or through its bottom, preferably from the bottom, into a reservoir apparatus 18 for holding the dirty developer. The dirty developer is then pumped from reservoir 18 through one or more ultrafiltration means such as ultrafiltration membranes depicted generally as 22, using a pumping mechanism 20. This pumping mechanism may also advantageously be used to control the flow rate of the dirty developer to the high pressure side of the membrane filters. A separation occurs in the membranes resulting in a clear liquid ("permeate") containing water and low molecular weight materials, and a remainder fluid or mass that consists of particles and high molecular weight materials. By means of tests described in the EXAMPLES section below, it has been surprisingly found that even after repeated cycles, this permeate is substantially equal in strength and activity to a fresh developer.

The permeate is allowed to return to the processor tank 14 for more development of plates, while the remainder is returned to the dirty developer reservoir 18. More dirty developer flows into the ultrafilters thus maintaining the cycle. The net result is that the working developer fluid in the processor tank is continually replenished with permeate of substantially equal strength so that the strength of the developer in the processor tank stays substantially constant. The catch pan 12 is preferably large enough to contain the volumes of the fluids in the processor tank 14 and dirty developer reservoir 18, to protect against any loss of fluid if all other protective measures fail.

In another embodiment, the above-described apparatus is further improved by having a tank 24 holding fresh developer fluid. This fresh developer may be separately pumped, using a pumping means 30 into the processor tank 14 whenever needed, by a separate line, or as FIG. 1 shows, it may be mixed with the permeate as the permeate is returned to the processor tank 14. If desired, the permeate liquid from the ultrafilters may be separately contained in a tank, from which it may be pumped into the processor tank either alone or in combination with fresh developer from 24. Thus, for example, if evaporation and track-out of developer from 14 results in the drain rate through 16 being lower than the return rate of the permeate from the filters to 14, and the fluid level in the dirty developer reservoir 18 drops, a low level detector 26 triggers the replenishment system which then delivers fresh developer to 14. This in turn increases the drain rate through 16, bringing up the fluid level in 18, and stopping the low level trigger.

Yet another embodiment consists of addition of an overflow line 28 from the processor tank 14 to the dirty developer reservoir 18. This may be in place of, or as FIG. 1 shows, in addition to, the drain pipe that goes from 14 to 18. Such a construction allows overflow of the dirty fluids from the processor tank to the dirty developer reservoir on a continual basis, when the fluid level in the tank reaches more than a certain optimum level. This allows and facilitates a continuous mode of the development operation.

Still another embodiment comprises including a pressure-sensitive restrictor means 34 in the path of the remainder from the filter to the dirty developer reservoir 18. Such a restrictor means maintains constant pressure on the flow of the remainder, irrespective of the flow rate.

The instant inventive apparatus and process advantageously allow the use of multiple number of filter cartridges in 22. This enables the system to run simultaneously on more than one cartridge to increase permeate flow rate, or on only one, to increase efficiency or to allow replacement of a cartridge without shutting down the system.

When the contents of the reservoir 18 ultimately become too viscous to be efficiently pumped through the ultrafilter, the contents may be treated with a suitable superabsorber such as, for example, polysaccharides, starches, gums, polymeric materials such as the SANWET® brand superabsorber (supplied by Hoechst Celanese Corporation, Somerville, N.J.) and the like, which converts the contents of 18 into a solid form that is suitable enough to be disposed of as a solid waste. When the filter rate of the filter has been reduced below a practical level, the filter may be flushed with suitable liquids such as, for example, fresh developer, water, or water acidified with acid, or water made alkaline with base. Water acidified with acid has been found to be very effective in the practice of the invention, when diazonium type photosensitive compounds are used in preparing the plates.

The ultrafiltration cartridges may be made of any suitable materials that can effectively separate the dirty developer into the permeate and the remainder. Preferred ultrafilters are polyether sulfone and polysulfone filters (nominal molecular weight in the range 8,000–10,000) on polyethylene terephthalate support or polypropylene support (available under the tradenames NADIRM® and MOLSEP® from Hoechst Celanese Corporation, Somerville, N.J. ).

Preparation of printing plates typically involves several steps and is well known in the art, and is described, for example, in U.S. Pat. No. 4,786,381 as well as pending U.S. patent application, Ser. No. 08/128,991 filed Sep. 29, 1993. Several kinds of photosensitive compounds, both negative and positive type, are used in the manufacture of printing plates. For example, U.S. Pat. No. 5,200,291 describes certain negative type diazonium type photosensitive compounds, as well as developers useful for developing such compounds after imagewise exposure of the plates. The present invention can be practiced with any such materials.

The following Examples are provided for illustrative purposes only. The invention is not intended to be limited in any way thereby.

EXAMPLES

Example 1

Construction of the Test bed: An ultrafiltration ("UF") module was constructed according to standard laboratory practices using a 2"×6" spiral cartridge having a permeation membrane of polyether sulfone, supported on polypropylene, with a nominal molecular weight cut off of 50K. The cartridge was operated at a membrane pressure of 70 psi and flow rate of 12 gpm during use.

The following describes the use of the inventive process and apparatus to rejuvenate a dirty developer from a typical printing plate manufacturing operation to a developer of substantially constant strength that can be used to develop more plates.

Example 2

Creating the Dirty Developer: A printing plate developer, such as that described in U.S. Pat. No. 4,592,992, essentially an aqueous 15% solution of salts and surfactants, was used to "develop" (rinse the coating off) negative subtractive printing plates. These plates are described in U.S. Pat. Nos. 4,661,432 and 4,840,867 and consist essentially of a chemically etched sheet of Al, coated with a 1 micron thick organic coating, consisting of approximately 50% resin, 30% organic pigment, and 20% photosensitive, oligomeric phenyl diazonium salt. About 5000 ft$^2$ of imagewise-exposed plates (80% rinsable area) were developed with 10 gallons of developer in a conventional plate processor (essentially a soak-and-scrub machine). This yielded about 7 gallons of dirty developer, consisting of a thick, green emulsion suspension, which was no longer usable as plate developer.

Example 3

Renewing (rejuvenating) the dirty developer in a batch operation: About five gallons of the dirty developer from Example 2 were treated in the UF module of Example 1 over 10 hours. At the end of that time, the developer had been concentrated to about 1.5 gallons of black, thicker liquid waste ("remainder"), leaving 3.5 gallons of renewed developer, a yellow aqueous solution ("permeate"). The permeate was tested for developing strength using a quantitative plate dip test and a qualitative process-of-use test, as described below:

Quantitative Dip Test: In the dip test, 50 ml of the permeate in a 100 ml beaker and 50 ml of the original developer in another 100 ml beaker were allowed to equilibrate to about 30° C. in a water bath. In identical procedures, 2"×4" test samples of the unexposed plate product used to dirty the developer were dipped into the beaker for a measured duration, withdrawn, and immediately forcefully sprayed with water. The degree of removal was noted, and the soaking duration was adjusted until a plate sample showed exactly half development. With both the fresh developer and permeate, it took exactly the same soaking time (4 seconds) to half-develop the plates, demonstrating that the developer had not lost or gained strength.

In contrast, when samples of fresh developer or permeate, diluted to 50% with water, were tested, they required 15 to 20 seconds soaking to half-develop the plate samples.

Qualitative Process of Use Test: About ten gallons of the permeate were returned to a plate processor used to develop plates and plates were developed under typical conditions. No difference between fresh developer and permeate was noticed. The plates developed by both the fresh and permeate were run side-by-side on a printing press, where no difference in rollup, scum/wash, resolution, or image integrity were observed.

Example 4

Processing the Waste: About five gallons of the liquid waste concentrate (remainder) from the renewal process of Example 2 were reconcentrated to 1.5 gal, using the same UF unit. About 50 ml of the resulting thick, black liquid was treated with 1 g of SANWET® IM-3500 NC superabsorbent, making it suitable for disposal as solid waste.

Examples 2–4 demonstrate that the present inventive process and apparatus is useful in a batch operation, to refresh used developer to strengths that are substantially as good as those of fresh developers. Similar successful results could be obtained in a continuous mode operation also.

Example 5

Continuous mode operation: Continuous mode of operation is described as follows. An experimental apparatus is set up according to FIG. 1 using the UF cartridge. Here, the dirty developer container is fed by overflow from the working plate processor tank and the permeate is fed back into the processor and the total volume is maintained by pumping fresh developer into the processor tank, where it overflows, raising the dirty developer level to a pre-set point.

Thus, for example, in a continuous mode, 10 gallons of developer (7 gallons in the processor tank and 3 gallons in the dirty developer reservoir) are continually filtered by the UF cartridge while 5,000 ft$^2$ of plates are processed and while fresh developer is automatically introduced from the fresh developer tank into the processor tank to keep the developer total at 10 gallons. Operation is similar to that in Examples 2–4. After the 5,000 ft$^2$ of plates have been processed, there are still 7 gallons of clean developer in the processor and 3 gallons in the dirty developer reservoir, consuming a total of 3 gallons of additional fresh developer.

The process is then run similarly for another 5,000 ft$^2$ of plates. This consumed, as described above, an additional 3 gallons of fresh developer, still leaving 7 gallons in the processor tank and 3 gallons in the dirty developer reservoir. This process continues until either the processor or the filtration unit needs to be shut down for cleaning. In this way, about 50,000 ft$^2$ of plates are processed by only about 30 gallons of developer, a substantial advantage over a conventional process which typically requires about 130 gallons of developer to process the same number of plates.

What is claimed is:

1. A process for developing lithographic printing plates comprising:
   (a) developing plates in a suitable processor with a fresh developer liquid, thereby generating used developer which contains both solids and liquid;
   (b) passing said used developer into a suitable reservoir container;
   (c) transporting said used developer through one or more ultrafiltration cartridges to generate a clear permeate liquid and a remainder;

(d) passing said permeate liquid into said processor in step (a) and developing more plates;

(e) returning said remainder into said reservoir container of step (b);

(f) repeating steps (a)–(e) one or more times; and (g) treating said remainder with an absorber to convert said remainder into a solid.

2. The process as described in claim 1, wherein said liquid level in said processor is maintained constant by direct flow of fresh developer.

3. The process as described in claim 1, wherein step (c) uses one ultrafiltration cartridge.

4. The process as described in claim 1, wherein step (c) uses a plurality of ultrafiltration cartridges.

5. The process as described in claim 1, wherein said ultrafiltration cartridge of step (c) is a polyether sulfone filter on a suitable support.

6. The process as described in claim 1, wherein said ultrafiltration cartridge of step (c) is a polysulfone filter on a suitable support.

7. The process as described in claims 5 or 6, wherein said support comprises polyethylene terephthalate.

8. The process as described in claims 5 or 6, wherein said support comprises polypropylene.

9. The process of claim 1 wherein said permeate liquid in step (d) is further replenished with fresh developer before passing into the processor of step (a).

10. The process of claim 1 further comprising the step of pumping fresh developer into the processor of step (a).

11. The process of claim 1 wherein the liquid levels of steps (b)–(e) are kept constant.

12. The process of claim 1 wherein the absorber is a material selected from the group consisting of starch, polysaccharides, gum and polymeric absorbers.

\* \* \* \* \*